United States Patent [19]

Sundaram

[11] Patent Number: 5,583,348
[45] Date of Patent: Dec. 10, 1996

[54] METHOD FOR MAKING A SCHOTTKY DIODE THAT IS COMPATIBLE WITH HIGH PERFORMANCE TRANSISTOR STRUCTURES

[75] Inventor: Lalgudi M. G. Sundaram, Scottsdale, Ariz.

[73] Assignee: Motorola, Inc., Schaumburg, Ill.

[21] Appl. No.: 801,249

[22] Filed: Dec. 3, 1991

[51] Int. Cl.$^6$ .......................... H01L 29/04; H01L 21/265
[52] U.S. Cl. .............................. 257/73; 257/477; 257/484; 257/486; 257/510; 257/515; 257/755; 257/757; 257/764; 257/765; 257/770; 257/771; 437/39; 437/63; 437/78; 437/175; 437/178; 437/189; 437/197; 437/200; 437/203; 437/228
[58] Field of Search ................................ 357/15; 257/73, 257/477, 484, 486, 510, 515, 755, 757, 764, 765, 770, 771; 437/39, 63, 78, 175, 178, 189, 197, 200, 203, 228, 15-37

[56] References Cited

U.S. PATENT DOCUMENTS

| | | | |
|---|---|---|---|
| 4,278,985 | 7/1981 | Stobbs | 257/477 |
| 4,860,065 | 8/1989 | Koyama | 257/477 |
| 4,862,244 | 8/1989 | Yamagishi | 257/484 |
| 4,956,688 | 9/1990 | Honma et al. | 257/477 |
| 5,140,383 | 8/1992 | Morris et al. | 357/15 |
| 5,144,404 | 9/1992 | Iranmanesh et al. | 357/15 |

*Primary Examiner*—Edward Wojciechowicz
*Attorney, Agent, or Firm*—Kevin B. Jackson

[57] ABSTRACT

A method for making a schottky diode structure (10) simultaneously with a polysilicon contact structure (31,33) to a transistor is provided. In a single process step, a polysilicon layer is patterned to expose a single crystal semiconductor region (22a) over one portion of a substrate, while leaving portions the polysilicon layer (31, 33, 29) intact over other portions of the substrate (22b). Multi-layer metal electrodes are deposited and patterned to form a rectifying schottky contact to the exposed single crystal region (22a), and to form an ohmic contact to the exposed polysilicon (31, 33, 29).

17 Claims, 6 Drawing Sheets

METHOD FOR MAKING A SCHOTTKY DIODE THAT IS COMPATIBLE WITH HIGH PERFORMANCE TRANSISTOR STRUCTURES

FIELD OF THE INVENTION

This invention relates, in general, to semiconductor devices and more particularly to a schottky diode structure which is compatible with high performance transistor structures.

BACKGROUND OF THE INVENTION

Bipolar and field effect transistors are well known in the semiconductor arts. High performance transistor structures require small geometry structures having very shallow junctions. For example, some bipolar transistors have base regions less than one micrometer deep and emitter junctions which are few tenths of a micrometer deep. Field effect transistors are made having channel, source, and drain diffusions of only a few tenths of micrometers. To achieve these shallow junctions, polysilicon structures are often required in order to make contact to the shallow device structures, since conventional metal and metal silicide technologies would destroy the shallow junctions. These polysilicon structures may be contact structures which serve only to pass current between a metal electrode and an active device region. Alternatively, the polysilicon structures may actually form portions of the active device, as in the case of polysilicon emitters in bipolar transistors and polysilicon drain and source regions in field effect transistors.

Although high performance transistors have many advantages, the use of these polysilicon structures has complicated, and in some cases precluded, the use of schottky diodes in conjunction with the transistor structures. Schottky diodes-are needed to provide high speed, non-saturating bipolar transistors, as well as interface circuits between various logic families such as TTL, ECL, and CMOS. Also, schottky diodes are valuable because they are fast, majority carrier devices.

Schottky diode structures are formed by a metal, such as platinum silicide, forming a rectifying junction with moderately to lightly doped N-type single crystal silicon. Devices having polysilicon contact structures required additional photolithography and etching steps to remove selected portions of the polysilicon contact structure in order to provide schottky structures.

In view of the above, it would be highly desirable to have a schottky diode structure which is compatible with high performance transistor structures without additional photolithography and process steps.

SUMMARY OF THE INVENTION

Briefly stated, the advantages of the present invention are achieved by a method for making a schottky diode structure simultaneously with a polysilicon contact structure to a transistor. In a single process step, a polysilicon layer is patterned to expose a single crystal semiconductor region over one portion of a substrate, while leaving the polysilicon layer intact over other portions of the substrate. Multi-layer metal electrodes are deposited and patterned to form a rectifying schottky contact to the exposed single crystal region, and to form an ohmic contact to the exposed polysilicon.

DETAILED DESCRIPTION OF THE DRAWINGS

Figure 1:
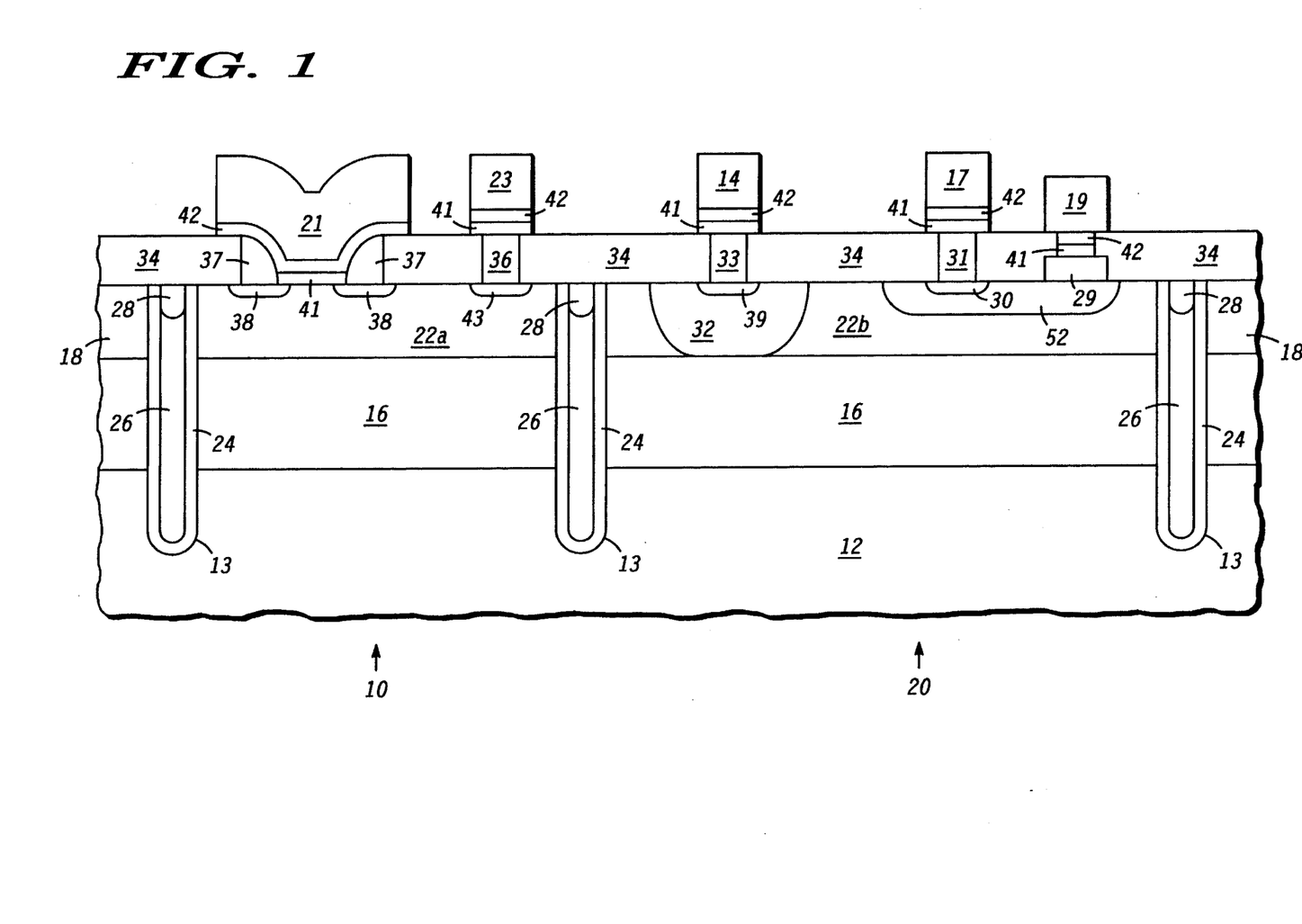
FIG. 1 illustrates a highly magnified cross-section of a portion of an integrated circuit in accordance with a first embodiment of the present invention.

FIG. 1 is a highly enlarged cross-sectional view of a schottky diode 10 and a transistor 20 integrated on a common substrate 12 in accordance with the present invention. Substrate 12 comprises monocrystalline silicon, has a P+ conductivity type and a dopant concentration on the order of $2\times10^{17}$ to $2\times10^{18}$ atoms/cm$^3$. A buried layer 16 is formed on substrate 12. Buried layer 16 as an N+ conductivity type and a dopant concentration on the order of $3\times10^{19}$ to $5\times10^{19}$ atoms/cm$^3$. An epitaxial layer 18 is formed on buried layer 16. Epitaxial layer 18 comprises single crystal silicon, has an N conductivity type and a dopant concentration on the order of $1\times10^{16}$ to $2\times10^{16}$ atoms/cm$^3$ preferably less than $1\times10^{17}$ atoms/cm$^3$. N+ buried layer 16, epitaxial layer 18 and other N type layers depicted in FIGS. 1–6 are doped with N type dopants such as arsenic, antimony or phosphorous.

Isolation trenches 13 extend through epitaxial layer 18, buried layer 16 and into substrate 12. Trenches 13 laterally isolate active device tubs 22a and 22b which are portions of epitaxial layer 18 disposed between trenches 13. Trenches 13 include a trench liner 24 comprising dielectric material. Trenches 13 are further filled with polysilicon 26. The top portion of polysilicon 26 is thermally oxidized to form a cap 28 which isolates polysilicon 26 of trenches 13. An example of a process for forming isolation trenches 13 is set forth by U.S. Pat. No. 4,994,406 issued on 19 Feb. 1991 to B. Vasquez and P. Zdebel entitled "Method of Fabricating Semiconductor Devices Having Deep and Shallow Isolation Structures". Although the isolation module described above and depicted by FIGS. 1–6 is shown exclusively herein, it should be understood that it is merely exemplary and that the present invention may be utilized with various other isolation structures which are well known in the semiconductor arts.

Although the transistor structure illustrated in active device tub 22b is a highly simplified NPN bipolar transistor, it should be understood that a wide variety of structures and device geometries may be used to form both bipolar transistors (NPN and PNP) as well as field effect structures (N-channel and P-channel). As used herein, the word "transistor" means a semiconductor switch having current carrying electrodes and a control electrode. For example, a method for making a PNP transistor which is compatible with the present invention is illustrated in copending U.S. patent application Ser. No. 627,285 filed on Dec. 14, 1990 by P. Zdebel entitled "Lateral Bipolar Transistor". A method for making a CMOS transistor structure which is compatible with the present invention is illustrated in U.S. patent application Ser. No. 649,189 filed on Feb. 4, 1991 by P. Zdebel entitled "CMOS Structure Fabrication".

The method for making a schottky diode in accordance with present invention is useful in any type of transistor structure which includes polysilicon contact structures analogous to poly-base 29, poly-emitter 31 and poly-collector 33 shown in FIG. 1. As used herein, the term "polysilicon contact structure" means a polysilicon region which forms a portion of an electrode of a semiconductor device, such as a base, emitter, collector, drain, source, gate, anode, cathode, or the like. The features of the present invention depicted in FIG. 1 and not yet described will be set out in greater detail hereinafter.

Figure 2:
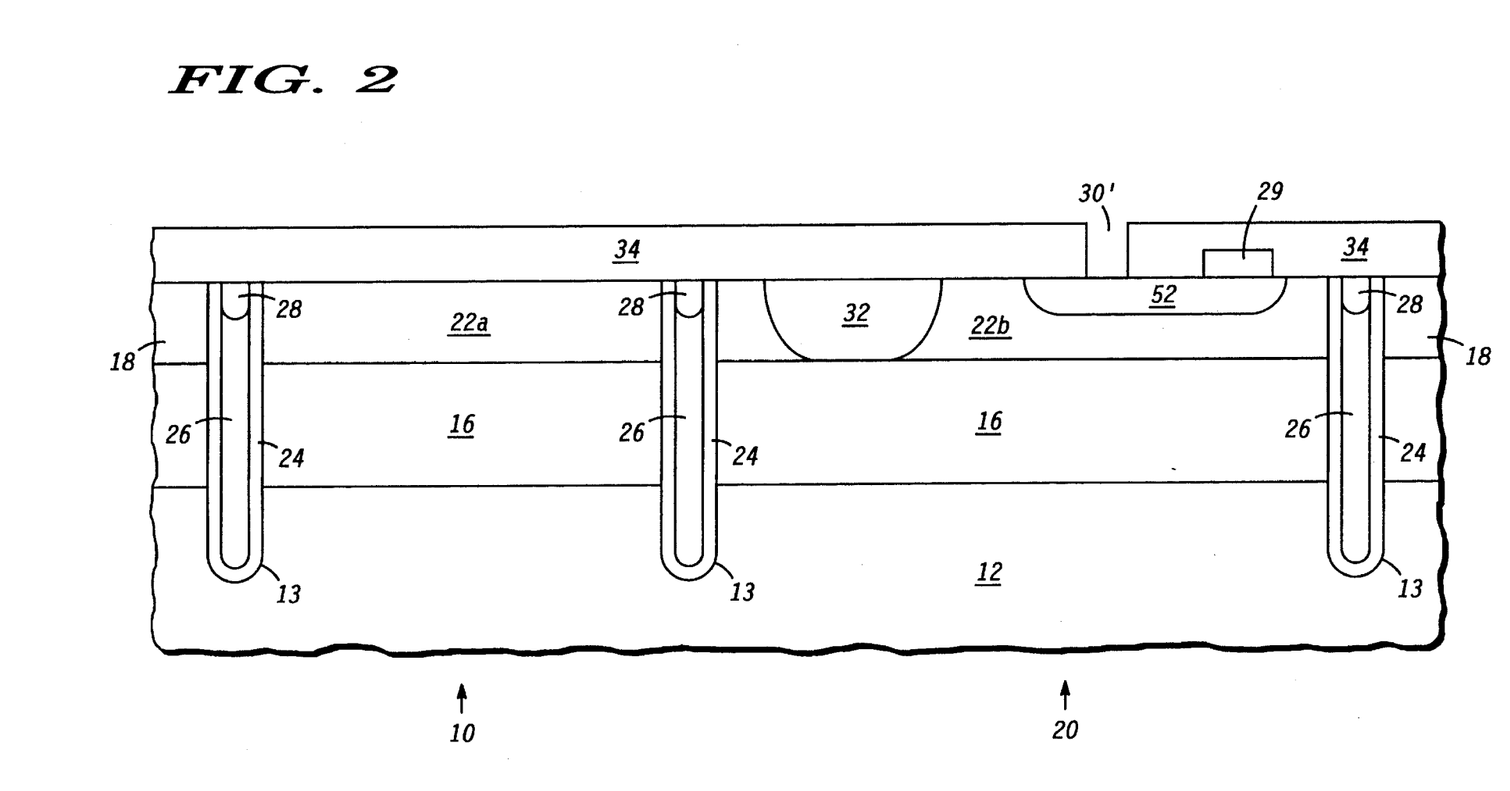
FIG. 2 illustrates the integrated circuit shown in FIG. 1 at an earlier stage of processing.

FIG. 2 illustrates the integrated circuit of FIG. 1 at an early stage in processing, after formation of a deep collector region 32 and a base region 52. Deep collector region 32 is N conductivity type and has a surface dopant concentrations on the order of $1 \times 10^{19}$ to $1 \times 10^{20}$ atoms/cm$^3$. In a preferred embodiment, deep collector 32 extends through active device tub 22b to couple to buried layer 16. Base region 52 is P conductivity type and has a surface dopant concentration in the range of $1 \times 10^{16}$ to $2 \times 10^{16}$ atoms/cm$^3$. Poly-base 29 comprises polysilicon having a P+ conductivity type and a sheet resistance on the order of 50 to 150 ohms/square. A P type dopant such as boron may be used to dope poly-base 29. Deep collector 32, base region 52, and poly-base 29 are formed by conventional semiconductor processing techniques including ion implantation, diffusion, photolithography, and thin film deposition which are well known in the semiconductor arts.

Active device regions 22a and 22b, as well as poly-base 29 are covered by a dielectric film 34. Dielectric film 34 comprises one or more layers of silicon oxide, silicon nitride, silicon oxynitride, or other dielectric material compatible with semiconductor processing. For purposes of the present invention, it is important that the upper surface of dielectric film 34 is resistant to a polysilicon etch process. As illustrated in FIG. 2, an emitter window 30' is etched in dielectric film 34 for the purpose of forming an emitter 30 (shown in FIG. 1) inside base region 52. Emitter 30 may be formed by ion implantation and anneal at this point, or in a preferred embodiment is formed later in the process, as will be seen.

Figure 3:
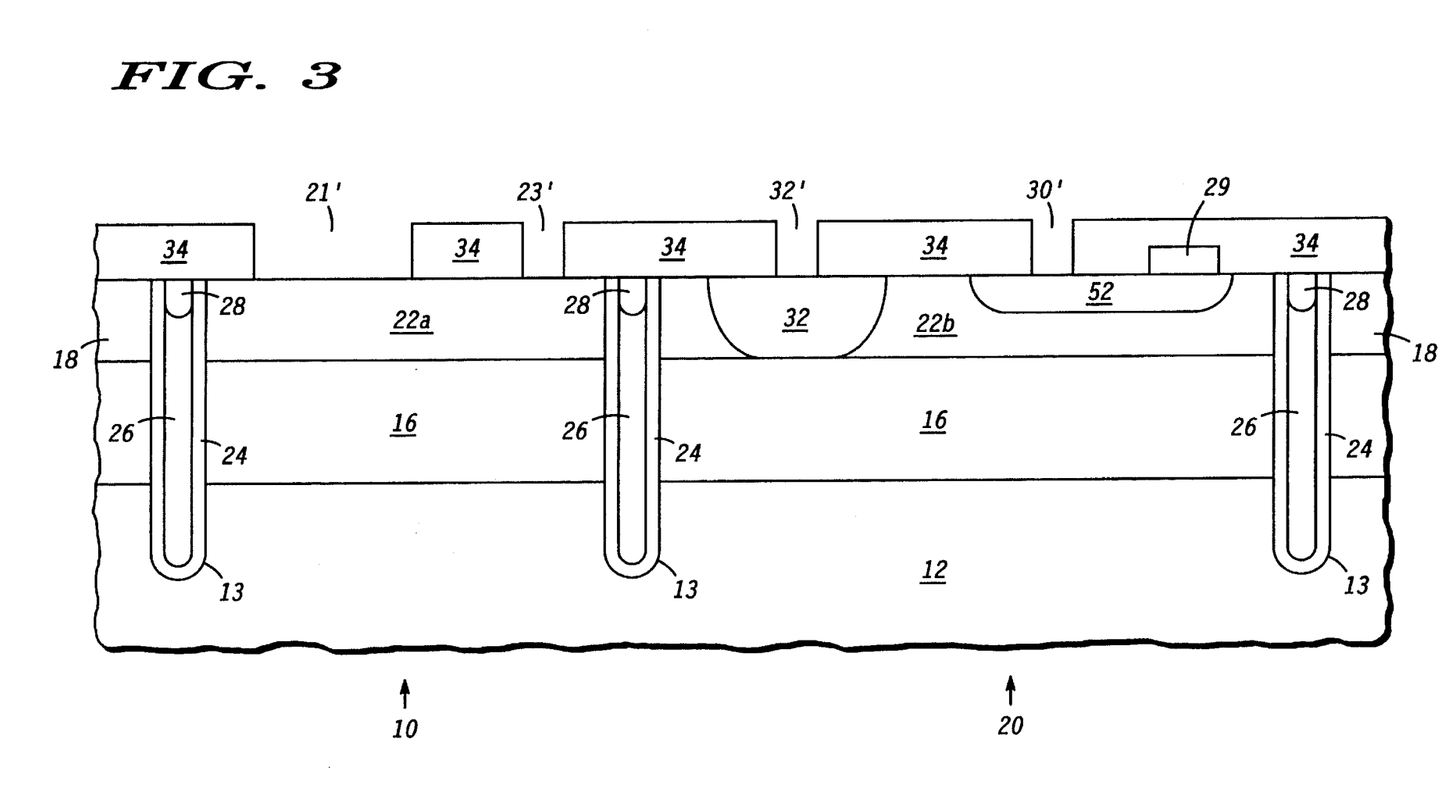
FIG. 3 illustrates the integrated circuit shown in FIG. 2 further along in processing.

FIG. 3 illustrates further processing of the structure shown in FIG. 2 in accordance with a first embodiment of the present invention. A collector contact window 32' is formed in dielectric film 34 over deep collector diffusion 32. Simultaneously, an anode window 21' and a cathode window 23' are formed using the same photolithography and etch steps used to form collector contact window 32'. Cathode window 23' and collector contact window 32' are generally as small a geometry as is permitted by the photolithography constraints of the equipment used. In the preferred embodiments, cathode window 23' and collector window 32' are approximately one micrometer wide, typically about eight tenths of a micrometer wide.

Figure 4:
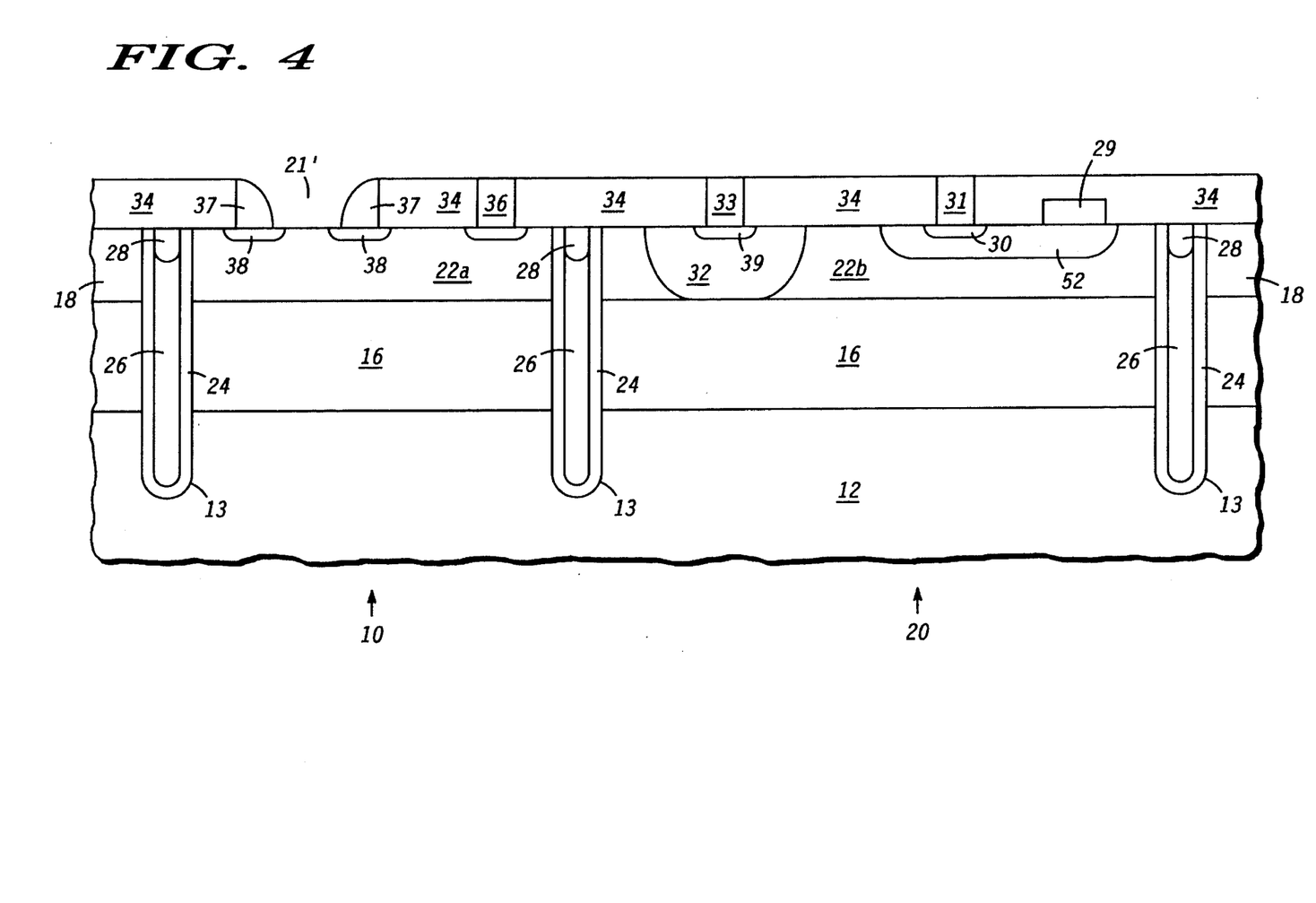
FIG. 4 illustrates the integrated circuit shown in FIG. 3 still further in processing.

An important feature of the method of the present invention is that anode window 21' is substantially wider than collector contact window 32'. In this embodiment, anode window 21' is approximately three times wider than collector contact window 32'. The structure shown in FIG. 3 is then covered with a polysilicon layer which may be doped or undoped. As shown in FIG. 4, the polysilicon layer is etched back during an unmasked etch to expose the upper surface of dielectric film 34. This etch back step results in polysilicon contact structures in the windows in dielectric film 34, including poly-emitter 31, poly-collector 33, and a poly-cathode 36'. Because anode window 21' is wide, however, the etch back process results in exposed single crystal silicon of active tub 22a, and formation of polysilicon sidewall spacers 37 at edges of anode window 21'. The polysilicon deposition and etch-back process is typical of processes used to form polysilicon contact structures.

When doped polysilicon is used, high temperature anneals and processing after deposition results in diffusion of dopant from the polysilicon into the upper surface of active tubs 22a and 22b. Both N type and P type dopants can be diffused simultaneously, depending on the doping type of a particular polysilicon region involved. This is an important feature of polysilicon contact structures since it can be used to form emitter 30 and collector enhancement region 39. Likewise, cathode contact region 43 is provided. An advantageous feature of the present invention is that dopants from sidewall spacers 37 diffuse to create guard rings 38 which, although not mandatory, are believed to improve performance of schottky diode 10.

Referring again to FIG. 1, a final window is opened in dielectric 34 to expose a portion of poly-base 29. A plurality of device electrodes are formed using multiple layers of metal. In the preferred embodiments, schottky metal layer 41 comprises platinum silicide, but any metal which makes a schottky contact with active device tub 22a is acceptable. Barrier layer 42 acts to prevent migration of material between layer 41 and overlying metal layers. In the preferred embodiments, barrier layer 42 comprises titanium tungsten alloy. Base electrode 19, emitter electrode 17, collector electrode 14, cathode electrode 23 and anode electrode 21 comprise a high conductivity material such as an aluminum copper alloy. The multiple metal layers are deposited and patterned using conventional deposition and photolithography steps well known in the semiconductor arts.

Layer 41 forms a schottky contact to the upper surface of active tub 22a, but makes ohmic contact to each of the polysilicon contact structures which remained after the polysilicon etch back step described hereinbefore. Thus, schottky diode 10 is provide simultaneously with the processes used to form ohmic polysilicon contact structures for transistor 20. If transistor 20 were a field effect transistor, schottky diode 10 could be formed simultaneously with formation of source or drain polysilicon contacts.

Figure 5:
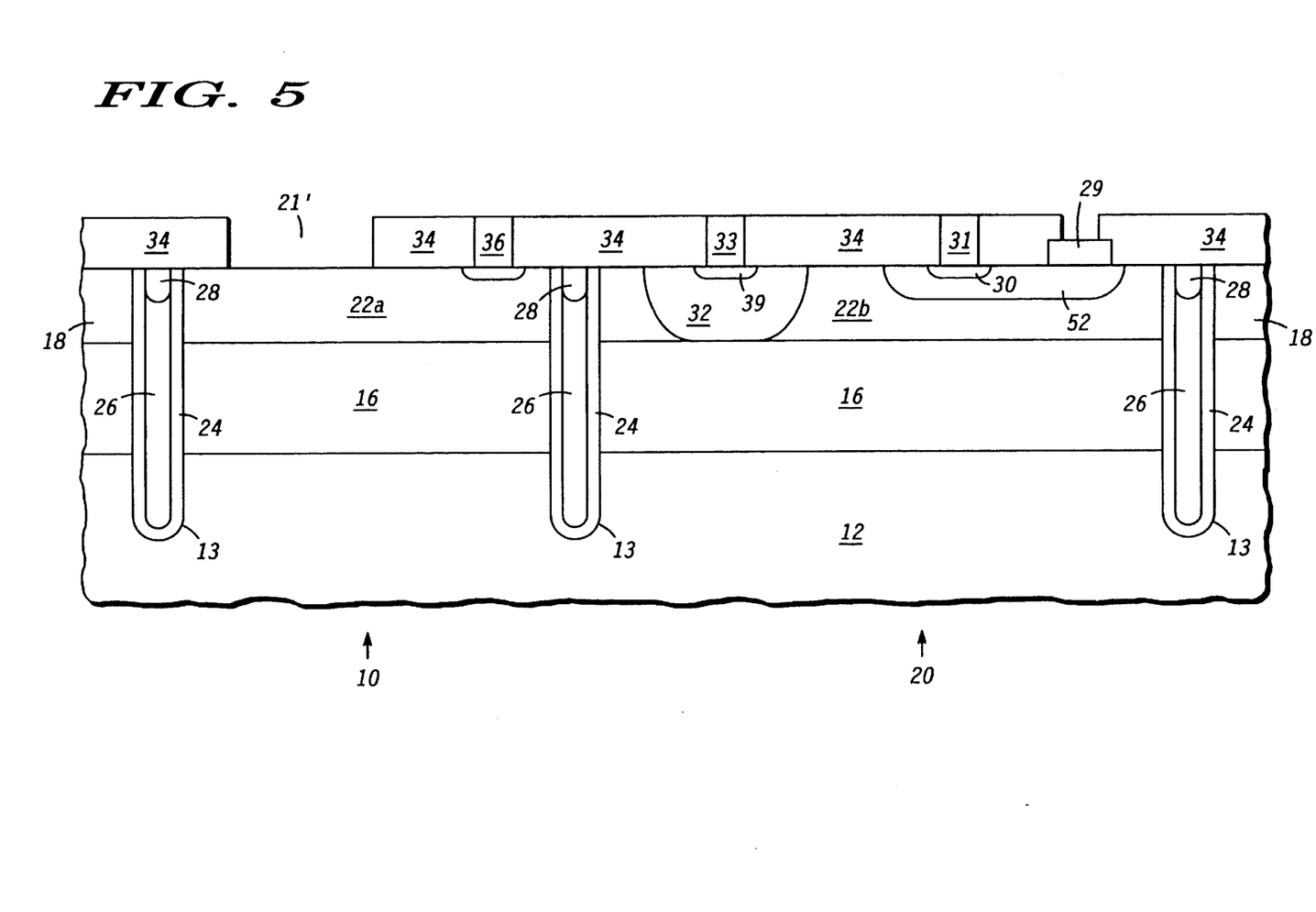
FIG. 5 illustrates a cross sectional view of a partially processed integrated circuit in accordance with a second embodiment of the present invention.

FIG. 5 shows a cross-sectional view of a schottky diode structure in accordance with a second embodiment method. Device structures which are the same in FIGS. 1–4 bear the same designation in FIG. 5. In the second embodiment, polysilicon emitter 31, poly-collector 33, and poly cathode 36 are formed as described hereinbefore Anode window 21' is formed after the polysilicon etch back step used to provide the polysilicon contact structures 31, 33 and 36, and simultaneously with the etch which exposes poly-base 29. Here, the method of the present invention makes advantageous use of the fact that dielectric film 34 can be etched highly selectively with respect to polysilicon used for poly-base 29. Because sidewall spacers 37 are not used, anode window 21' may be somewhat narrower in the second embodiment, for example two to three times the size of the window over poly-base 29.

Figure 6:
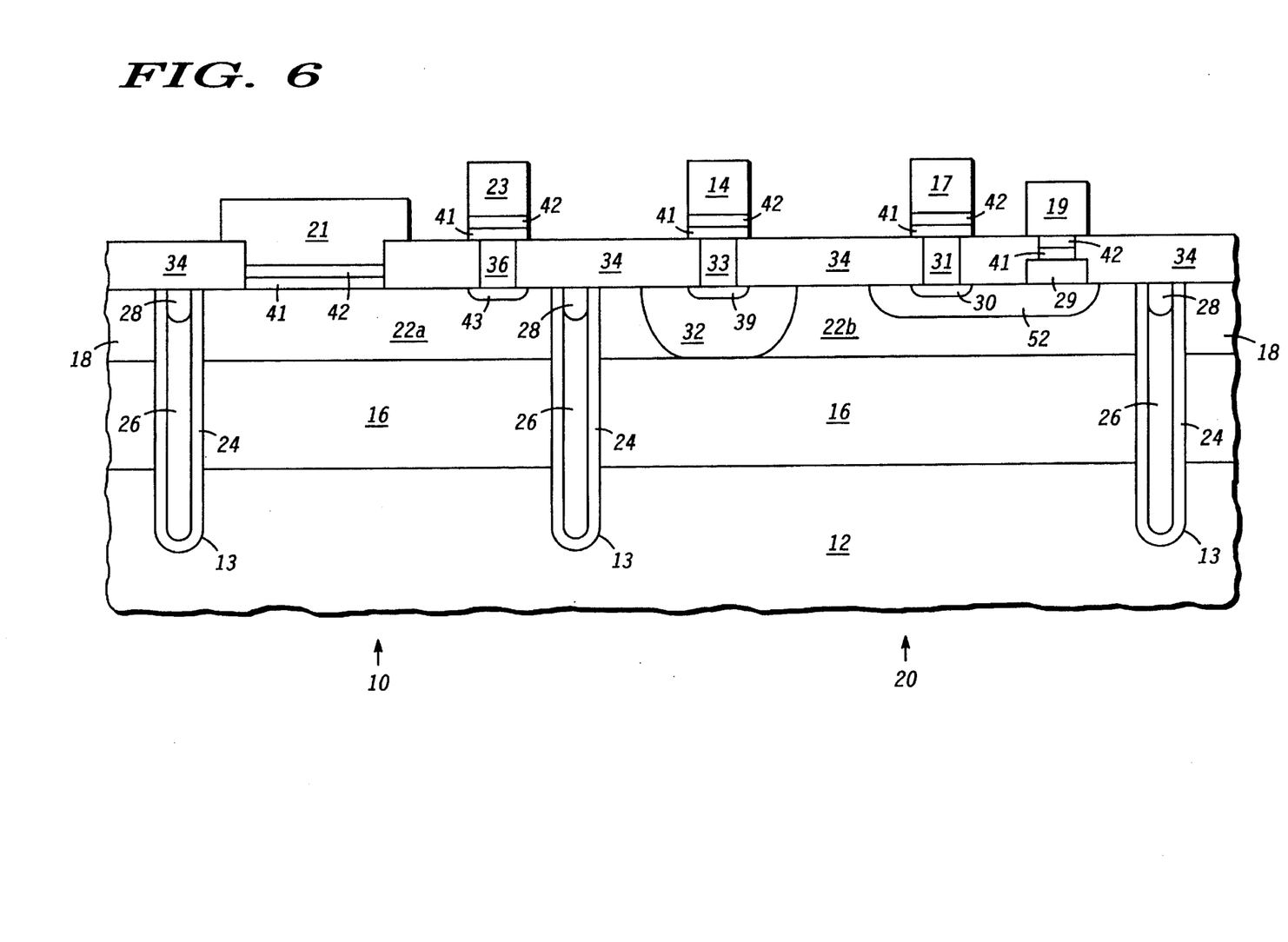
FIG. 6 illustrates the integrated circuit shown in FIG. 5 at a later stage of processing.

FIG. 6 illustrates the second embodiment shown in FIG. 5 further along in processing. Platinum silicide layer 41, barrier layer 42, and low resistivity metal regions 14, 17, 19, 21, and 23 are deposited and patterned simultaneously to form schottky diode 10 and ohmic contacts to transistor 20.

Unlike the first embodiment, the second embodiment does not provide sidewall spacers 37 or guard rings 38 (shown in FIG. 1) near the anode of schottky diode 10. Like the first embodiment, a single photolithography and etch step is used to expose a polysilicon region on one portion of the integrated circuit and single crystal active device tub 22a in another portion of the integrated circuit.

The actual device structure disclosed herein may be fabricated in accordance with the method described in U.S. Pat. No. 5,026,663 issued on Jun. 25, 1991 to P. Zdebel and B. Vasquez and entitled "Method of Fabricating a Structure having Self-Aligned Diffused Junctions".

The structure disclosed herein has many distinct advantages. A majority carrier schottky diode structure is provided in an integrated circuit process with transistor structures without any additional photolithography processing steps or substantial cost. The schottky diode structure does not require additional diffusion steps, so does not adversely effect total thermal budget for the integrated circuit. Moreover, the schottky diode allows greater flexibility for the integrated circuit designer to make non-saturating TTL logic, interface circuits, transient suppressors and voltage controlled capacitors. The schottky diode provided by the method of the present invention has outstanding electrical characteristics including breakdown voltage greater than 15 V and leakage of a few nanoamps at typical operating voltage of 5 V.

There is provided in accordance with the invention a greatly improved integrated circuit having both schottky diodes and transistor structures. While specific embodiments of the invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of the invention.

I claim:

1. A schottky diode structure integrated with a high performance transistor structure comprising:

a first substantially straight-walled trench isolated semiconductor device tub comprising N-type material of moderate doping concentration;

a second substantially straight-walled trench isolated semiconductor device tub;

a schottky diode formed in the first substantially straight-walled trench isolated semiconductor device tub;

a transistor having current carrying electrodes and a control electrode formed in the second device tub, wherein at least one of the transistor electrodes comprises a polysilicon contact structure;

an N-type cathode contact region formed in the first device tub and having a higher doping concentration than the first device tub;

a cathode electrode ohmically coupled to the cathode contact region; and an anode electrode making schottky contact to the first device tub.

2. The structure of claim 1 wherein the anode electrode further comprises: a platinum silicide region forming a schottky junction with the first device tub; a titanium-tungsten alloy covering the platinum silicide region; and an aluminum alloy covering the titanium-tungsten alloy.

3. The structure of claim 2 wherein the cathode electrode further comprises: a poly-cathode in ohmic contact with the cathode contact region; a platinum silicide layer forming an ohmic contact with the poly-cathode; a titanium-tungsten alloy covering the platinum silicide layer; and an aluminum alloy covering the titanium-tungsten alloy.

4. The structure of claim 3 wherein the cathode, anode, and the transistor electrodes are formed and patterned simultaneously.

5. The structure of claim 4 wherein the first device tub has a dopant concentration less than $1\times10^{17}$ atoms/cm$^3$, and the cathode contact region has a surface dopant concentration greater than $1\times10^{19}$ atoms/cm$^3$.

6. A schottky diode that is compatible with high performance transistor structures comprising:

a substantially straight-walled trench isolated N type device tub;

a diffused N type cathode enhancement region disposed in the tub;

a polysilicon contact structure in contact with the N type cathode enhancement region;

an anode electrode making schottky contact to the tub; and a cathode electrode making ohmic contact to the cathode enhancement region, wherein the anode and cathode electrodes have identical material composition.

7. The schottky diode of claim 6 wherein the tub comprises N type epitaxial silicon and has a dopant concentration on the order of $1\times10^{16}$ to $2\times10^{16}$ atoms/cm$^3$, and the cathode enhancement region has a surface dopant concentration greater than $1\times10^{19}$ atoms/cm$^3$.

8. The schottky diode of claim 6 wherein the anode and cathode electrodes comprise sequentially formed layers of platinum silicide, titanium-tungsten alloy, and aluminum-copper alloy.

9. The schottky diode of claim 6 further comprising a guard ring surrounding the anode electrode.

10. The schottky diode of claim 9 further comprising a doped polysilicon sidewall spacer surrounding the anode electrode over the guard ring.

11. A method for making a schottky diode compatible with a high performance transistor structure comprising the steps of: providing a P-type semiconductor substrate; forming an N-type semiconductor layer on the substrate; providing an isolation region extending through the N-type semiconductor layer to a portion of the P-type substrate, wherein portions of the N-type semiconductor layer form a first active device tub and a second active device tub which are laterally isolated by the isolation region, and wherein the isolation region is provided by an isolation trench; providing a transistor in the second active device tub; forming a dielectric film on the N-type layer; opening contact windows of a first width in the dielectric film to expose portions of the transistor; opening a cathode window of the first width to expose a portion of the first active device tub; opening an anode window of a second width to expose another portion of the first active device tub; forming polysilicon contact structures in the contact windows; forming a poly-cathode in the cathode window; forming an anode electrode making schottky contact to the portion of the first active device tub exposed by the anode window; forming a cathode electrode ohmically coupled to the poly-cathode; and forming transistor electrodes ohmically coupled to the polysilicon contact structures.

12. The method of claim 11 wherein the step of forming the polysilicon contact structures further comprises covering the dielectric film, the exposed portions of the first active device tub and the exposed portions of the transistor with polysilicon and etching back the polysilicon using an unmasked etch to form the polysilicon contact structures while removing the polysilicon from the anode window.

13. The method of claim 12 wherein the etch back step provides polysilicon sidewall spacers at edges of the anode window.

14. The method of claim 11 wherein the step of forming the anode electrode further comprises the steps of: forming a platinum silicide region in the anode window; covering the platinum silicide region with a barrier layer; covering the barrier layer with an ohmic metal layer comprising an aluminum alloy.

15. The method of claim 14 wherein the step of forming the transistor electrodes further comprises the steps of: forming platinum silicide regions ohmically coupled to the polysilicon contact structures; covering each of the platinum silicide regions with a barrier layer; covering each of the barrier layers with an ohmic metal layer comprising an aluminum alloy.

16. The method of claim 15 wherein the step of forming the anode electrode and the step of forming the transistor electrodes are performed simultaneously.

17. The method of claim 11 further comprising the steps of: forming a polysilicon sidewall spacer at edges of the anode window; doping the sidewall spacer; and diffusing the dopant from the sidewall spacer into the first active device tub to form a guard ring.

* * * * *